(12) United States Patent
Ohta

(10) Patent No.: US 8,403,708 B2
(45) Date of Patent: Mar. 26, 2013

(54) TERMINATING CONNECTOR

(75) Inventor: Toshio Ohta, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 36 days.

(21) Appl. No.: 13/056,790

(22) PCT Filed: Jul. 22, 2009

(86) PCT No.: PCT/US2009/051377
§ 371 (c)(1),
(2), (4) Date: Jan. 31, 2011

(87) PCT Pub. No.: WO2010/014470
PCT Pub. Date: Feb. 4, 2010

(65) Prior Publication Data
US 2011/0136383 A1    Jun. 9, 2011

(30) Foreign Application Priority Data

Aug. 1, 2008    (JP) ................................ 2008-200085

(51) Int. Cl.
*H01R 13/66* (2006.01)
(52) U.S. Cl. ................................. 439/620.04
(58) Field of Classification Search ............. 439/620.04, 439/620.21, 620.03; 361/119; 324/762.02
See application file for complete search history.

(56) References Cited

U.S. PATENT DOCUMENTS

| | | | | |
|---|---|---|---|---|
| 4,239,319 A | * | 12/1980 | Gladd et al. | ............. 439/620.21 |
| 5,034,846 A | * | 7/1991 | Hodge et al. | .................. 361/119 |
| 5,118,308 A | | 6/1992 | Liu et al. | |
| 5,451,173 A | * | 9/1995 | Mai | .......................... 439/620.29 |
| 6,273,758 B1 | | 8/2001 | Lloyd et al. | |
| 6,524,135 B1 | * | 2/2003 | Feldman et al. | .......... 439/607.46 |
| 7,063,544 B2 | * | 6/2006 | Gunn et al. | ...................... 439/78 |
| 7,140,920 B1 | * | 11/2006 | Lin | ............................. 439/620.3 |
| 7,372,288 B2 | * | 5/2008 | Takemoto | ................ 324/762.02 |
| 7,823,280 B2 | * | 11/2010 | Chung et al. | .................... 29/856 |
| 2003/0040203 A1 | * | 2/2003 | Kuroda et al. | ................... 439/98 |
| 2011/0136383 A1 | * | 6/2011 | Ohta | ........................ 439/620.04 |

FOREIGN PATENT DOCUMENTS

| | | |
|---|---|---|
| JP | S59-33686 U | 3/1984 |
| JP | S63-191584 | 12/1988 |
| JP | H2-165 | 1/1990 |
| JP | 1990-67577 | 5/1990 |
| JP | 2005310436 | 11/2005 |
| JP | 2005310492 | 11/2005 |
| JP | 2005310655 | 11/2005 |

OTHER PUBLICATIONS

International Search Report for PCT/US2009/051377, pp. 4.

* cited by examiner

*Primary Examiner* — Alexander Gilman
(74) *Attorney, Agent, or Firm* — Robert S. Moshrefzadeh

(57) ABSTRACT

Provided is a terminating connector that can connect probes to a terminal connected with desired cable cores without removing the terminating connector. One aspect provides a terminating connector comprises a plurality of terminals having a contact portion and a lead wire contact portion, a housing having a plurality of probe insertion portions and receiving the terminals, and a resistor element received in the housing and electrically connected to the terminals, wherein at least a part of the terminals is positioned in the probe insertion portions.

8 Claims, 6 Drawing Sheets

TERMINATING CONNECTOR

CROSS REFERENCE TO RELATED APPLICATIONS

This application is a national stage filing under 35 U.S.C. 371 of PCT/US2009/051377, filed Jul. 22, 2009, which claims priority to Japanese Application No. 2008-200085, filed Aug. 1, 2008, the disclosure of which is incorporated by reference in its/their entirety herein.

FIELD

The present invention relates to a terminating connector with a resistor element installed in the connector inner part.

BACKGROUND

A so called bus-type network, where more than one digital device, such as a measurement device, is connected to one common mother line called a bus, is used in a network such as factory automation (FA). In a bus-type network, termination resistors having the same size of characteristic impedance of transmission lines need to be connected to the cable ends in order to prevent unnecessary signal reflection from the bus cable end.

Terminating connectors with which termination resistors are installed in the connector inner part in order to facilitate attachment of termination resistors are known. Termination resistors can be easily connected by connecting such terminating connectors to output-side connectors of devices which are connected to the end of a bus-type network. For example, Patent Document 1 (Unexamined Utility Model Application Publication No. S63-139775) describes connectors for transmission line termination as "an insulating plug that has a terminal which is made to be electrically contacted with output-side plug 33 and has a plurality of terminals for attaching electronic parts 1a in the upper part, wherein a terminal resistor 50 for obtaining the required termination is connected by soldering and the like on terminal 1a that corresponds to the terminal of output-side plug 33 of this plug 1".

SUMMARY

As mentioned above, a terminating connector that can connect probes with terminals that are connected to desired cable cores without removing a terminating connector is desired.

When communication failure occurs in a bus-type network, it is necessary to be able to easily distinguish machine failure from cable failure (disconnection) for early failure restoration. When terminating using the terminating connector, probes of a measurement device such as a tester needs to be connected to terminals of the output connector which is connected to the desired core line of a cable after removing the terminating connector. However, since a connector generally has more than one terminal and the application of each terminal varies, appropriate terminals must be selected for the measurement. For example, when supplying power and signal transmission are performed by one connector, it is necessary to select terminals that are in charge of signal transmission for recovery of communication failure. In addition, the terminals are arranged with a narrow pitch inside the opening of the output connector attached to the device. Thus, when attempting to contact two probes of a tester to adjacent terminals, the probes may contact each other or may be in contact with the unnecessary terminals, resulting in poor workability, which has been an issue of network maintenance operation.

One aspect of the present invention provides a terminating connector comprises a plurality of terminals having a contact portion and a lead wire contact portion, a housing having a plurality of probe insertion portions and receiving the terminals, and a resistor element received in the housing and electrically connected to the terminals, wherein at least a part of the terminals is positioned in the probe insertion portions.

According to the terminating connector in accordance with one aspect of the present invention, cable failure diagnosis is possible without removing the terminating connector from a device and probes of the tester can be easily connected to the terminals connected to the desired cable cores.

REFERENCE NUMERALS

Figure 1:
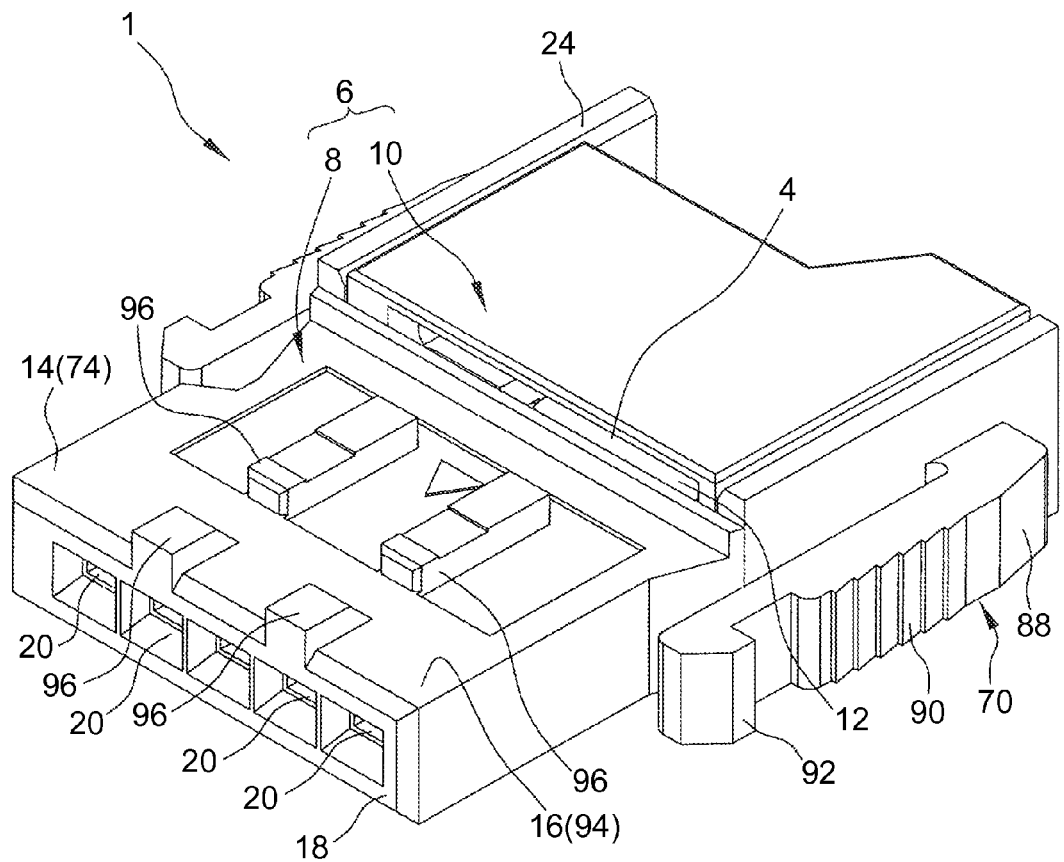
FIG. 1 is a perspective view of a terminating connector according to one embodiment of the present invention.

1 Terminating connector
2 Terminal
4 Resistor element
6 Housing
8 Body
10 Cover
12 Window
26 Probe insertion portion
36 Groove
42 Recess
48 Resistor element compartment
50 Main body compartment
52 Lead wire receiving channel
54 Lead wire insertion hole
76 Bottom surface
98 Terminal contact portion
100 Lead wire contact portion
102 Base portion

DETAILED DESCRIPTION

The terminating connector of the present embodiment comprises a plurality of terminals having a lead wire contact portion and a terminal contact portion which contacts with terminals of other connectors, a resistor element that is electrically connected to two of the terminals, and a housing for the terminals and the resistor element. The resistor element has a resistance value that substantially matches the characteristic impedance of the cable electrically connected to the resistor element. The housing is equipped with a plurality of probe insertion portions that extend in the insertion direction of the terminating connector, and a part of the installed terminals are positioned interior of the probe insertion portions. Therefore, the probes can be connected to the terminals electrically connected with desired cable cores by inserting the probes of a measurement device, such as a tester, into the probe insertion portions. In addition, the probe insertion portions are open in the vicinity of the connector end opposite to a joint side of the connector. Thus, measurement using a tester can be easily performed without interference from adjacent connectors even when connectors are arranged at a high density from right to left or up and down. The housing of the terminating connector is equipped with a body and a cover and the termination resistor is housed in the termination connector compartment of the connector.

When the cover in which a termination resistor is installed is mounted from above onto the rear end of the body from which the lead wire contact portions of the terminals are exposed, the lead wires of the resistor element is pressure-contacted on the lead wire contact portions of the terminals, which allow the resister element to be easily attached to the connector.

Figure 2:
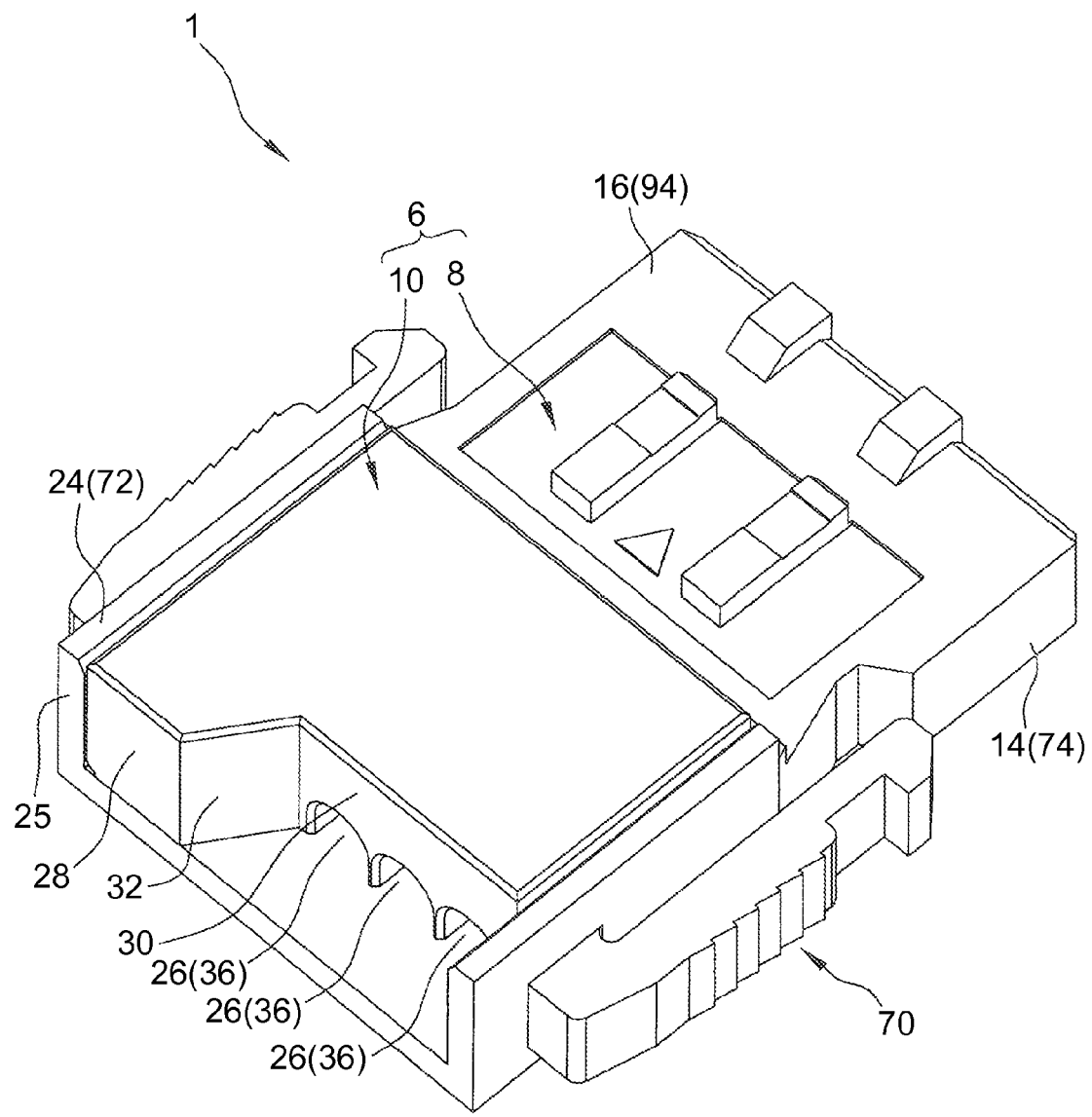
FIG. 2 is a perspective view of a terminating connector according to one embodiment of the present invention.

A terminating connector 1 of the present invention is described in detail by referring to the following drawings. FIG. 1 and FIG. 2 are perspective views of the terminating connector 1 in accordance with one embodiment of the present invention. The terminating connector 1 is an approximately parallelepiped-shape plug-type connector and is equipped with a plurality of terminals 2 (Refer to FIG. 4), a resistor element 4 that is electrically connected to two of the terminals 2, and a housing 6 that houses the terminals 2 and the resistor element 4. The housing 6 comprises a body 8 and a cover 10 mounted on the body 8. The terminating connector 1 is further equipped with a window 12 on the upper surface 14 of housing 6 through which an installed resistor element 4 can be viewed. The window 12 is a portion of the connector 1 where one end surface of the cover 10 is exposed to the upper surface 14 of the housing 6.

The body 8 and the cover 10 can be manufactured from an arbitrary material, for example, a resin such as polycarbonate, by an arbitrary method such as injection molding.

One end of the housing 6 is formed as a joint 16 and the joint 16 is received in the opening of a socket connector, not shown in the figure, to which the terminating connector 1 is connected.

Figure 4:
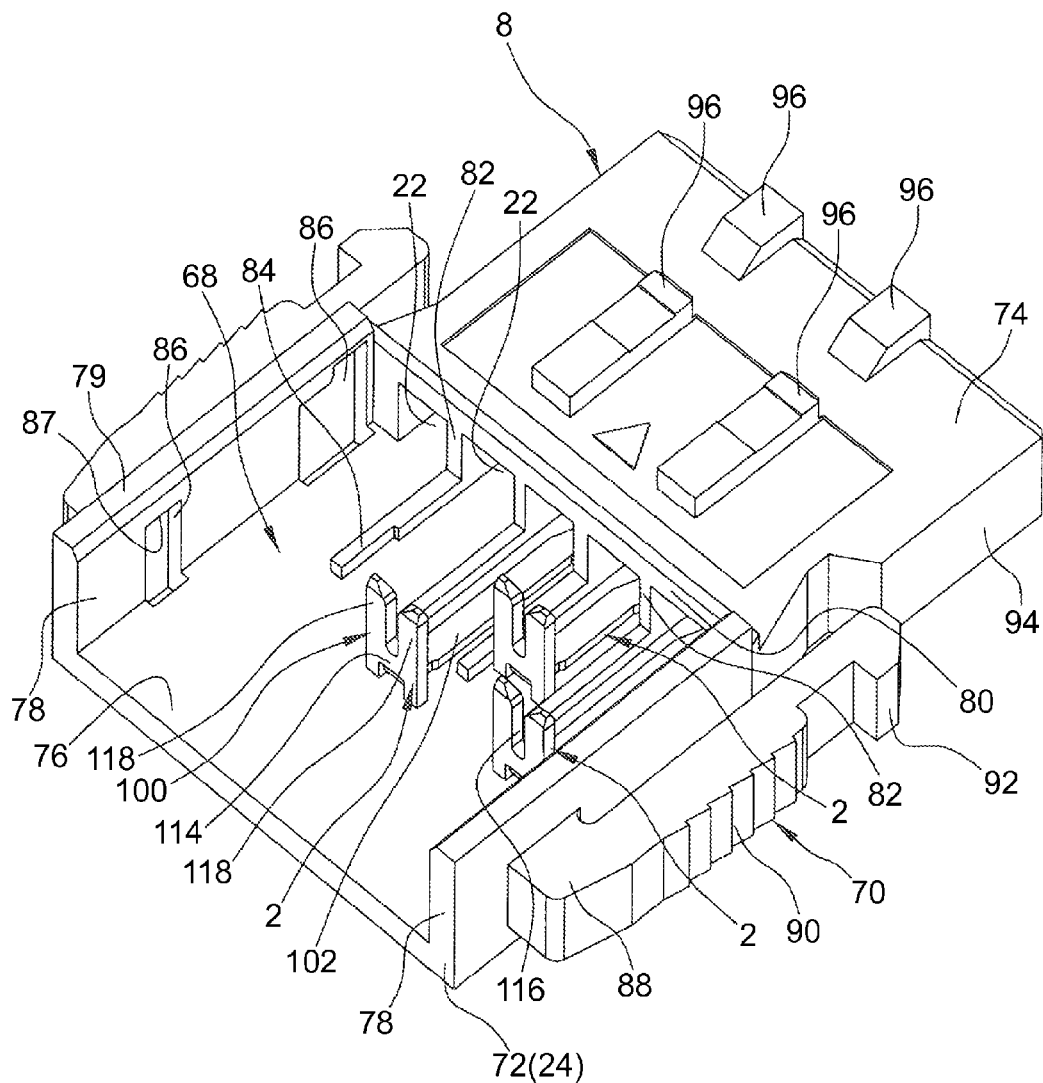
FIG. 4 is a perspective view of a body according to one embodiment of the present invention.

On the end surface 18 of joint 16, a plurality of terminal insertion openings 20, in which the terminal of the socket connector is inserted, are arranged in the width direction of housing 6 at approximately equal intervals. On the inner side of the terminal insertion opening 20, terminal receiving holes 22 are provided as the same number of terminal insertion openings 20, and terminals 2 are positioned in some of terminal receiving holes 22 (FIG. 4).

As shown in FIG. 2, a plurality of probe insertion portions 26 is provided on the rear end 24, which is an end opposite to the end of housing 6 where the joint 16 is provided. Probe insertion portions 26 are holes that extend in the insertion direction of the terminating connector 1, specifically, from the rear end 24 side to the joint 16 side. Probe insertion portions 26 are for inserting the probes of a measurement device, such as a tester, in order to measure resistance values of the transmission lines to which the terminating connector 1 is electrically connected. In the present embodiment, inner space of the probe insertion portions 26 is demarcated by the cover 10 and the body 8. Since the probe insertion portions 26 are formed so that they open toward the second end surface 30 of the cover 10 receded from the end surface 25 on the rear end 24 side of the housing 6, the length of the probe insertion portions 26 can be made short. In general, handles of the probes of a tester and the like are formed to be thicker than the tip. Thus when the probes are inserted into adjacent probe insertion portions 26 arranged at a narrow pitch, insertion into adjacent probe insertion portions 26 may be impossible due to interference of the handles. However, when the probe insertion portions 26 are formed to be short, two probes can be inserted by inclining them toward the extending direction of the probe insertion portions 26 which allows more distance between the probes at the portions, and interference of the handles may be prevented.

The cover 10 is equipped with a first end surface 28 that forms approximately the same plane as the end surface 25 of housing 6, a second end surface 30 that is provided by being receded from the first end surface 28, and an inclined surface 32 that links the first end surface 28 with the second end surface 30.

Figure 3:
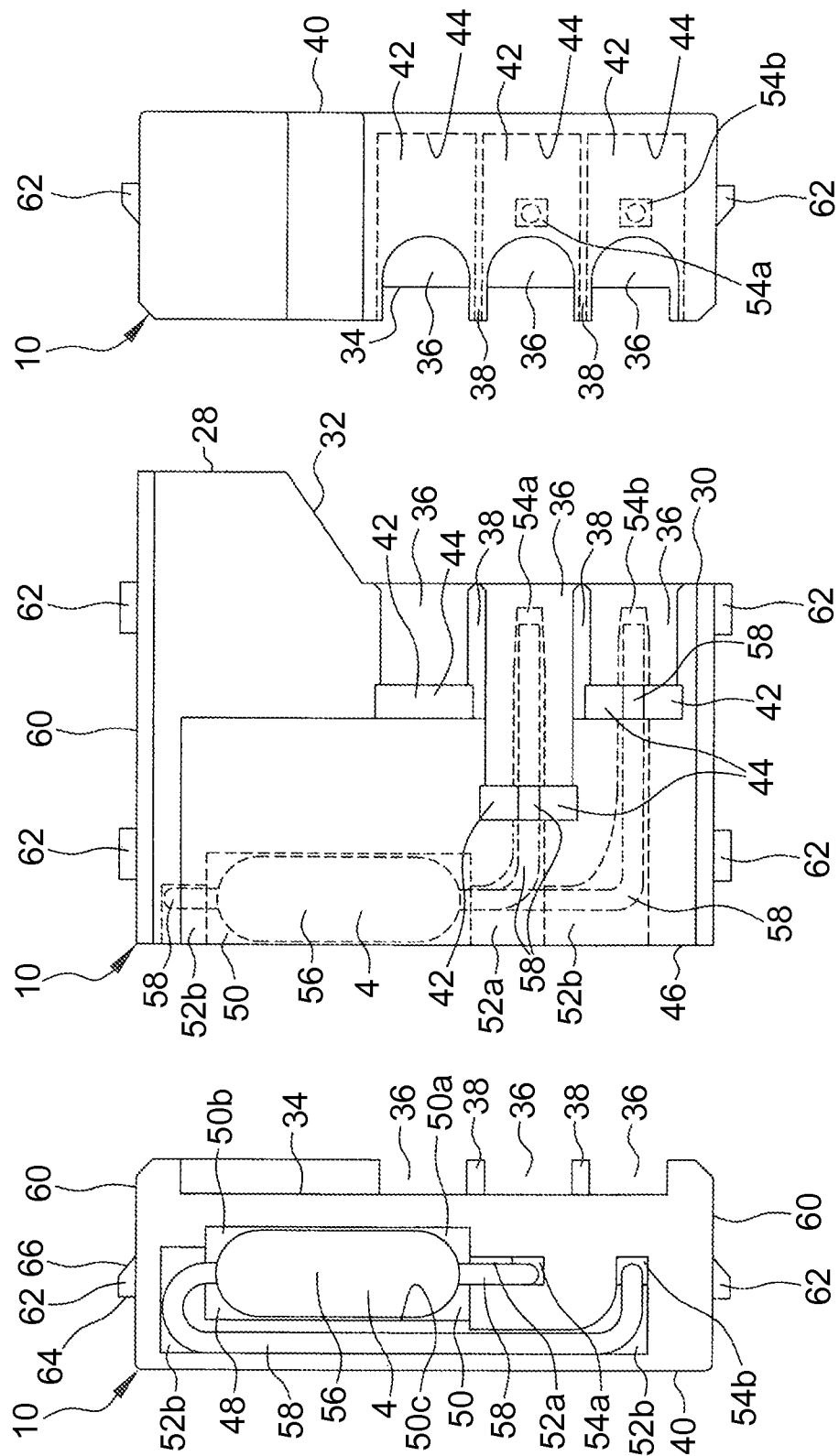
FIGS. 3A, 3B, and 3C show a plan view of a cover according to one embodiment of the present invention.

FIG. 3 is a plan view that shows a front side view (a) a bottom view (b) and a rear side view (c) of cover 10. A plurality of grooves 36 having their cross-sectional shape being approximately a semi-circle are adjacently provided on the lower surface 34 of the cover 10. The probe insertion portions 26 are the holes demarcated by the grooves 36 in collaboration with the bottom surface 76 of the body 8 facing the grooves 36. The grooves 36 are open toward the second end surface 30 of cover 10 and extend from the rear end 24 side of the terminating connector 1 to the joint 16 side. A separation wall 38 is provided between adjacent grooves 36.

The grooves 36 comprise recesses 42 located in the end of the grooves 36 opposite to the second end surface 30. The grooves 36 extend from the lower surface 34 side of the cover 10 to the upper surface 40 side. The recesses 42 are formed to be deeper than other portions of the grooves 36, and are equipped with a bottom surface 44 located adjacent to the upper surface 40 of the cover 10. Since the length of a plurality of respective adjacent grooves 36 is different, adjacent recesses 42 are arranged at different locations in relation to the insertion direction of the terminating connector 1. As described later, the recesses 42 receive a lead wire contact portion 100 which is the widest portion of terminal 2. By adjacent recesses 42 being at different locations in relation to the insertion direction of the terminating connector 1, it is possible to easily secure the thickness of the separation wall 38 that separates the adjacent recesses 42 which allows the array pitch of terminal 2 to be the smallest.

On the front end surface 46 of cover 10, the resistor element compartment 48 is provided as a recess that houses the resistor element 4. The resistor element compartment 48 is equipped with a main body compartment 50 and lead wire receiving channels 52. The main body compartment 50 is hollow, where as the planar shape is rectangular, and houses the main body 56 of resistor element 4. The lead wire receiving channels 52 are shallower than the main body compartment 50 and receives the lead wires 58 of the resistor element 4. The first lead wire receiving channel 52a has a groove-like shape and extends from one end 50a of the longitudinal direction of the main body compartment 50. The second lead wire receiving channel 52b is provided adjacent to the other end 50b of the main body compartment 50 and the side surface 50c of the main body compartment 50. The second lead wire receiving channel 52b is formed to be in a groove shape beyond one end 50a of the main body compartment 50 and the length of the groove-shaped portion is longer than the length of the first lead wire receiving channel 52a.

At near the tip of each lead wire receiving channel 52, lead wire insertion holes 54 that extend in the insertion direction of terminating connector 1 are arranged. The lead wire insertion holes 54 extend beyond the recesses 42 up to the vicinity of the second end surface 30. Four inner surfaces of the lead wire insertion holes 54 are inclined in the vicinity of the end of the second end surface 30 side, so that the lead wire insertion holes 54 are narrower at the ends. The first lead wire insertion hole 54a that is in communication with the first lead wire receiving channel 52a has a cross-sectional shape of approximately a square shape across the entire length. For the second lead wire insertion hole 54b that is in communication with the second lead wire receiving channel 52b, the opening on the lead wire receiving channel 52 side is a rectangle with longer axis in cover 10 vertical direction and the height of the lead wire insertion hole 54b is gradually decreased as it approaches the recesses 42 side (Refer to FIG. 5.) and forms an approximately square shape in the vicinity of the recesses 42. In the portion where the cross-sectional shape is approximately square, the two lead wire insertion holes 54a and 54b are positioned at approximately the same in relation to the thickness direction of the cover 10.

The cover 10 is equipped with two engaging projections 62 on both respective side surfaces 60. The engaging projections 62 have an engaging surface 64 that is approximately parallel to the cover upper surface 40 and an inclining surface 66 that is positioned on the opposite side of the engaging surface 64 and is provided by inclining toward the side surface 60 of the cover 10.

As shown in FIG. 4, the body 8 is equipped with a cover receiving part 68 that receives the cover 10, and a pair of latch levers 70. The cover receiving part 68 formed in the rear end 72 of the body 8 is equipped with a bottom surface 76 approximately parallel to upper surface 74 of the body 8, a side wall 78 extending upward from the bottom surface 76 in the insertion direction of the terminating connector 1, and a front wall 80 extending upward from the bottom surface 76 in the direction bisecting the side wall 78 at an approximately right angle.

On the front wall 80, one end of a plurality of terminal receiving holes 22 extending in the insertion direction of the terminating connector 1 is open. The present embodiment has five terminal receiving holes 22 as illustrated; however, the terminals 2 are only inserted into three of the terminal receiving holes 22. A protrusion wall 84 is provided on the bottom surface 76 in continuation with the separation wall 82 that separates two adjacent terminal receiving holes 22. The protrusion wall 84 extends from the front wall 80 toward the rear end 24 side of the terminating connector 1. The terminals 2 that were inserted into the terminal receiving holes 22 are adjacent to each other through the protrusion wall 84 in the cover receiving part 68.

A plurality of engaging recesses 86 is provided on the side wall 78. An engaging projection 62 provided on the body 8 is engaged in the engaging recess 86 in order to prevent the cover 10 from falling away from the body 8 after the cover 10 is joined to the body 8.

A latch lever 70 is equipped with a base edge 88 that joins with the side wall 78 in the vicinity of the rear end 72 of body 8, a lever main body 90 that extends forward in relation to the insertion direction of the terminating connector 1 from base edge 88, and an engaging projection 92 that is provided at the end of the lever main body 90. The engaging projection 92 is a portion that is protruded from the lever main body 90 to the side and is inserted in the engaging hole of the socket connector, not shown in the figure, to maintain the joint state between the terminating connector 1 and the socket connector.

The housing 6 is equipped with a plurality of key projections 96 provided with a protrusion on the upper surface 74 of the joint 94 of body 8. These key projections 96 are positioned at locations non-symmetrical to the center line (not shown in the figure) of the width direction of joint 94. Key grooves corresponding to the key projections 96 are provided in the openings of the socket connector, not shown in the figure, that receives the terminating connector 1 in order to prevent the terminating connector 1 from being inserted into the socket connector in the wrong direction.

The resistor element 4 that is used for the terminating connector 1 of the present embodiment is a resistor element having a fixed resistance value and, as shown in FIG. 3, is equipped with a main body 56 in an approximately cylinder shape and lead wires 58 that extend from the respective longitudinal direction of both ends of the main body 56. On the surface of the main body 56, typically a plurality of lines to display resistance values of the resistor element 4 is printed. The lead wires 58 are metallic wire-shape portions provided in an integrated manner with the main body 56.

As shown in FIG. 3, the resistor element 4 is housed in the resistor element compartment 48 of cover 10 in a state such that the lead wires 58 are bent to have a shape corresponding to the arrangement of the lead wire insertion holes 54 and the lead wire receiving channel 52.

The lead wires 58 that extend from one end of the main body 56 are inserted into the first lead wire insertion hole 54a, after being extended in the longitudinal direction of the main body 56 in the first lead wire receiving channel 52a, by being bent at an approximately right angle in the vicinity of the position where the first lead wire insertion hole 54a is open toward the first lead wire receiving channel 52a. Then, the end of the lead wires 58 is arranged in the vicinity of the end of the first lead wire insertion hole 54a beyond the recess 42.

The other lead wire 58 is immediately bent to the upper surface 40 side of the cover 10 after it extends from the end of main body 56 and makes a U-turn in the second lead wire receiving channel 52b and extends approximately parallel to the main body 56 along the main body compartment 50. Then, the lead wire 58 is bent at an approximately right angle toward the lower surface 34 of the cover 10 in the vicinity of the end of the grooves of the second lead wire receiving channel 52b and in the position where the second lead wire insertion hole 54b is open. Then, the lead wire 58 is further bent in the extension direction of the lead wire insertion holes 54 and is inserted in the second lead wire insertion hole 54b. The end of this lead wire 58 is arranged in the vicinity of the end of the second lead wire insertion hole 54b beyond the recess 42.

Figure 5:
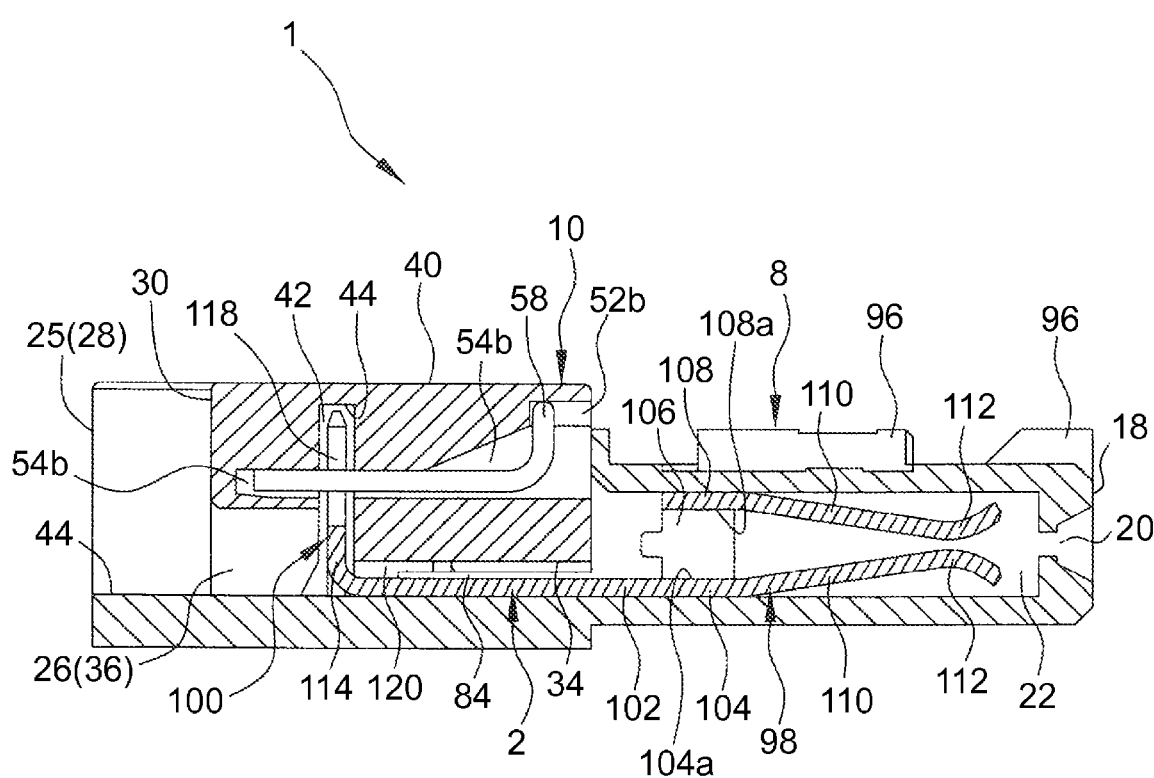
FIG. 5 is a cross-sectional view of the terminating connector at A-A cross section of FIG. 2.

As shown in FIG. 5 which is a cross-sectional view of the terminating connector 1, the terminals 2 are equipped with a terminal contact portion 98 that connects with the terminal of another connector, a lead wire contact portion 100 where the lead wire 58 of the resistor element 4 is connected, and a base portion 102 that links the terminal contact portion 98 with the lead wire contact portion 100. The terminals 2 can be manufactured by bending sheet metal materials such as copper, for example.

The terminal contact portion 98 is equipped with a lower part 104 that extend from one end of the base portion 102, and an upper part 108 spaced from the lower part 104. The upper part 108 and the lower part 104 has approximate square plate like shape, and is arranged in parallel each other such that a main surface 104a of the lower part 104 faces a main surface 108a of the upper part 108. A link 106 is provided to connect the lower part 104 and upper part 108. The link 106 is connected to one side edge of the lower part 104 and the upper part 108. An arm 110 extends from each end of the longitudinal direction of the terminal 2 of the upper part 108 and the lower part 104. In the vicinity of the end of arm 110, a convex 112 is formed by bending so as to become convex facing toward the opposing arm 110. The terminal 2 is electrically connected with the terminal of the socket connector on the surface of the convex 112.

The base portion 102 is a thin plate like portion of the terminal 2 that links the terminal contact portion 98 with the lead wire contact portion 100, and links with the terminal contact portion 98 in the end part of the lower part 104 opposite to the end part from which the arm 110 extends. The base portion 102 is formed to have a width narrower than that of the terminal contact portion 98 or lead wire contact portion 100.

As shown in FIG. 4, the lead wire contact portion 100 is a part of the terminal 2 that extends from the end part of the base portion 102 in a direction approximately perpendicular to the base portion 102. The lead wire contact portion 100 is equipped with a base edge 114 and a pair of pressure contacting blades 118 extending in parallel to each other separated by the slit 116 in the in-plane direction of the base edge 114, which is the direction away from the base portion 102. The pressure contacting blades 118 are formed to have narrow tips so that the width of the slit 116 will be spread in the end part opposite the side of the base edge 114. The slit 116 has a width smaller than the thickness of the lead wire 58. Because of that, when the lead wire 58 is press-fit into slit 116, the pressure contacting blades are elastically deformed in the direction away from each other and sandwich the lead wire 58 with their elastic rebound force. Therefore, the lead wire 58 is mechanically fixed and electrically connected to the terminals 2. In the present embodiment, two kinds of terminals 2 that are different in length of the base portion 102 are used; however, there is no difference between those two terminals 2 other than the base portion 102 length.

Figure 6:
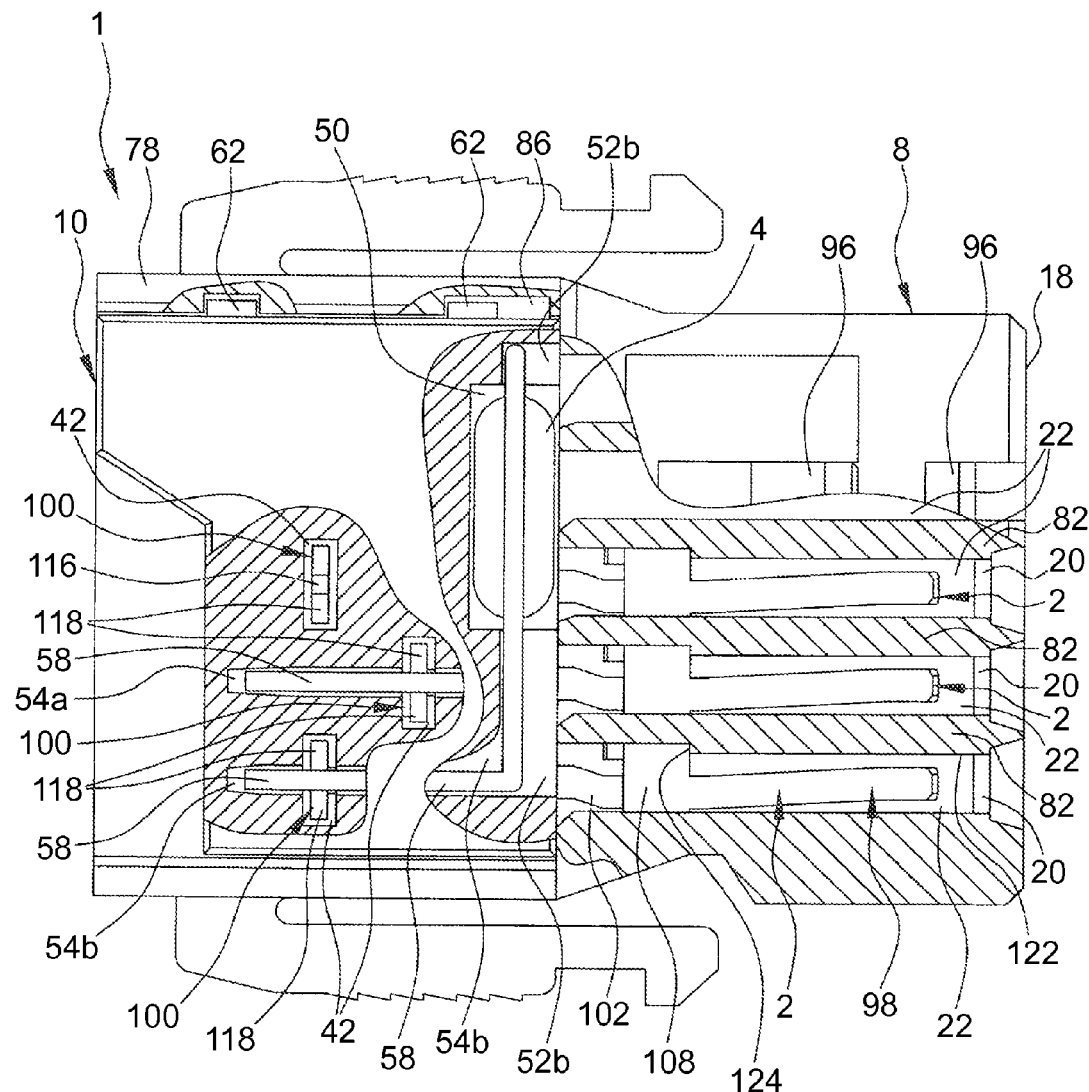
FIG. 6 is a partial cutaway view of a terminating connector according to one embodiment of the present invention.

FIG. 6 is a partial cutaway view of the terminating connector 1. The housing 6 is equipped with terminal insertion openings 20 that are provided on the edge surface 18 of the body 8 and the terminal receiving holes 22 are provided in the body 8 inner part by being adjacent to the terminal insertion openings 20 and extend in the insertion direction of the terminating connector 1.

The terminal receiving holes 22 are holes having rectangular cross-sectional shape with a height and width that can receive the terminal contact portion 98 of the terminals 2 and provided in the body 8 inner part. The terminal contact portion 98 of terminals 2 is inserted in the terminal receiving holes 22. On one side surface 122 of the terminal receiving holes 22, the contact surface 124 is provided and the link 106 of the terminals 2 is contacted. The position of terminal 2 is made to be in the longitudinal direction of the housing by inserting the terminal 2 into the terminal receiving holes 22 until the link 106 contacts the contact surface 124.

As shown in FIG. 5, the housing 6 is equipped with linking holes 120 that communicate with the terminal receiving holes 22 at one end and communicate with the probe insertion portions 26 at another end. The linking hole 120 is a space formed between the lower surface 34 of the cover 10 and the bottom surface 76 of the body 8, and the height of the linking holes 120 is structured to be lower than the height of the terminal receiving holes 22. The base portion 102 of terminal 2 is housed in the linking holes 120 and the base portion 102 is arranged in a manner that the longitudinal direction of the terminal 2 is approximately parallel to the insertion direction of the terminating connector 1. A plurality of linking holes 120 is provided corresponding to the terminal receiving holes 22 and adjacent linking holes 120 are divided by the protrusion wall 84. The probe insertion portion 26 is a space that extends in the insertion direction of the terminating connector 1, and is demarcated by grooves 36 provided on the cover 10 and bottom surface 76 of the body 8. The probe insertion portions 26 are equipped with the recesses 42 that extend in the thickness direction of the housing 6 in the end part of the linking holes 120 side. The recesses 42 have a depth size greater than the height of the lead wire contact portion 100 and a width size greater than the width of the lead wire contact portion 100. The lead wire contact portion 100 of the terminals 2 rises approximately perpendicular to the bottom surface 76 of the body 8 in the vicinity of the recesses 42, vertically crosses the probe insertion portions 26. Approximately the upper half portion of the lead wire contact portion 100 is received in the recesses 42.

The lead wire 58 of resistor element 4 passes from the lead wire receiving channel 52 through lead wire insertion holes 54 to the recesses 42 and is electrically and mechanically connected with the lead wire contact portion 100 of the terminals 2. In the recesses 42, the lead wire 58 is guided to slit 116 of terminal 2 and sandwiched there by the pressure contacting blades 118 there. In order for the lead wire 58 to be stably connected by the lead wire contact portion 100 of the terminals 2, it is preferable that the position of the lead wire 58 that is protruded toward the recesses 42 in the height direction (position in the thickness direction of the terminating connector 1) is approximately the same in relation to all lead wire insertion holes 54. The reason is that, since the sandwiching force of the lead wire 58 varies depending on the position in the height direction of the lead wire contact portion 100, all lead wires 58 can be sandwiched at an optimal position of the lead wire contact portion 100.

The lead wire 58, as described later, is press-fit to the slit 116 of the terminals 2 from above. In the present embodiment, the lead wire 58 inserted in the lead wire insertion hole 54 is supported by the lead wire insertion holes 54 on both sides of the recesses 42. For this reason, it is easy to press-fit the lead wire 58 into slit 116 against the resistance force at the time of inserting the lead wire 58 into terminals 2.

The lead wire insertion holes 54 are arranged on the upper surface 40 side of the cover 10 in comparison to the grooves 36 in relation to the thickness direction of the housing 6. Because of that, the lead wire 58 and the lead wire contact portion 100 are connected to the inner part of the recesses 42 in the vicinity of the upper surface 40 of cover 10 in comparison with the grooves 36. When the probe of a tester and the like is inserted in the probe insertion portion 26 of the terminating connector 1 formed as such, the tip of the probe contacts the vicinity of the base edge 114 of the terminals 2 that is protruded to the probe insertion portions 26, but does not contact the portion of the terminal 2 sandwiching the lead wire 58 by the pressure contacting blades 118. Therefore, the probe can become contacted with the terminals 2 without affecting the connection state between the lead wire 58 and the lead wire contact portion 100.

Next, a method to assemble the terminating connector 1 in the present embodiment is explained.

The lead wire 58 of resistor element 4 is bent according to the state in which the resistor element 4 is stored in cover 10 to form the resistor element 4 in an approximate L-shape.

Next, the respective two lead wires 58 of resistor element 4 are inserted in the corresponding lead wire insertion holes 54 and the main body 56 of resistor element 4 is arranged in the main body compartment 50. At this time, the length of the lead wire 58 and the position of the resistor element 4 can be adjusted so that the end of the lead wire 58 will reach the vicinity of the end of the lead wire insertion holes 54.

The cover 10 on which the resistor element 4 is arranged is arranged above the cover receiving part 68 in a state that the upper surface 40 of the cover 10 and the upper surface 74 of the body 8 are approximately parallel. When the inclining surface 66 of the engaging projection 62 of cover 10 is contacted with the edge 79 of body 8, the body 8 and the cover 10 can be arranged in this state.

The cover 10 is moved toward the body 8 until the bottom surface 76 of the body 8 and the cover 10 are contacted. At this time, the lead wire 58 that is protruded to the recesses 42 of the cover 10 is inserted into the slit 116 of the terminals 2. The lead wire 58 is sandwiched by pressure contacting blades 118 and electrically connected to the terminals 2. In addition, the engaging projection 62 of the cover 10 is positioned in the engaging recesses 86 beyond edge 79 of the body 8, and the cover 10 is engaged in the body 8 in a manner that the engaging surface 64 of the engaging projection 62 and the engaging surface 87 of the engaging recesses 86 are facing each other.

The present invention was explained according to this embodiment; however, a wide range of variations other than the above described embodiment can be performed.

For the window 12, it is also possible that a through-hole which communicates with the resistor element compartment 48 be provided on the upper surface 40 of the cover 10, instead of providing it by using a step difference area between the cover 10 and the body 8.

The number of terminals 2 that are not connected to the lead wire 58 can be an arbitrary number and it is also possible that the terminating connector 1 have a plurality of resistor elements 4.

A method of electrically connecting the lead wire 58 to the terminals 2 is not limited to a method by two facing pressure contacting blades 118. For example, it is also possible that the lead wire 58 be sandwiched between the end of a lead wire contact portion 100 that does not have a slit and the bottom surface 44 of the recesses 42. Or, it is also possible that the lead wire 58 and the terminals 2 be elastically contacted. If elastically contacted, it is also possible that the terminals 2 and the lead wire 58 are inclined to be arranged and the end of the lead wire 58 be bent by interrupting the terminals 2. Or, it is also possible that the lead wire be flexed by a part of the terminals 2 being in contact with the lead wire 58 from the side.

In the above-mentioned embodiment, the grooves 36 that are arranged on the lower surface 34 of the cover 10 form probe insertion portions 26 in collaboration with the bottom surface 76 of the body 8. As an example of a variation of this, it is also possible that the holes that extend in the same direction as the grooves 36 be provided on the cover 10 to form the probe insertion portions 26 only with the cover 10. In addition, it is also possible that the grooves in which a part of the terminals 2 is protruded are provided on the upper surface 40 of the cover 10 so that the grooves are to be probe insertion portions.

What is claimed is:

1. A terminating connector comprising: a plurality of terminals having a terminal contact portion and a lead wire contact portion; a housing having a plurality of probe insertion portions and receiving the terminals; and a resistor element received in the housing and electrically connected to the terminals; wherein at least a part of the terminals is positioned in the probe insertion portions, the housing comprising a body and a cover, the resistor element electrically connecting to the terminals as a result of the cover being mounted onto the body.

2. The terminating connector of claim 1 wherein the probe insertion portions are holes extending in the insertion direction of the terminating connector.

3. The terminating connector of claim 1 wherein the probe insertion portions are open at the end of the terminating connector opposite to a joint side, the joint side being configured to be received in an opening of a mating connector.

4. The terminating connector of claim 1 wherein the part of the terminals positioned in the probe insertion portions is the lead wire contact portion, extending in a direction intersecting with the insertion direction of the connector.

5. The terminating connector of claim 1 wherein the resistor element is housed in the resistor element compartment of the cover.

6. The terminating connector of claim 5 wherein the probe insertion portions are holes demarcated by the body and a groove provided on the lower surface of the cover.

7. A terminating connector of claim 1 wherein the housing has a window through which a main body of the resistor element can be viewed from exterior of the connector.

8. A terminating connector of claim 7 wherein the window is provided between the cover and the body.

* * * * *